United States Patent
Beyer et al.

(10) Patent No.: US 7,452,812 B2
(45) Date of Patent: Nov. 18, 2008

(54) METHOD TO CREATE SUPER SECONDARY GRAIN GROWTH IN NARROW TRENCHES

(75) Inventors: Gerald Beyer, Leuven (BE); Sywert H. Brongersma, Eindhoven (NL)

(73) Assignee: Interuniversitair Microelektronica Centrum vzw, Leuven (BE)

( * ) Notice: Subject to any disclaimer, the term of this patent is extended or adjusted under 35 U.S.C. 154(b) by 0 days.

(21) Appl. No.: 11/733,650

(22) Filed: Apr. 10, 2007

(65) Prior Publication Data
US 2007/0238294 A1    Oct. 11, 2007

Related U.S. Application Data

(60) Provisional application No. 60/790,634, filed on Apr. 10, 2006.

(30) Foreign Application Priority Data
Dec. 15, 2006    (EP)    .................................. 06126251

(51) Int. Cl.
*H01L 21/44* (2006.01)

(52) U.S. Cl. ...................................... 438/687; 438/637
(58) Field of Classification Search ................ 438/687, 438/618, 637, 150; 257/E23.145, E23.142
See application file for complete search history.

(56) References Cited

U.S. PATENT DOCUMENTS

| | | | |
|---|---|---|---|
| 2005/0150770 A1* | 7/2005 | Chen | 205/123 |
| 2005/0153545 A1* | 7/2005 | Hong | 438/650 |
| 2005/0153548 A1* | 7/2005 | Hong | 438/687 |
| 2005/0186793 A1* | 8/2005 | Omoto et al. | 438/687 |

* cited by examiner

*Primary Examiner*—Thao P. Le
(74) *Attorney, Agent, or Firm*—Knobbe Martens Olson & Bear LLP

(57) ABSTRACT

The present invention relates to a method for obtaining enlarged Cu grains in small trenches. More specifically it related to a method for creating enlarged copper grains or inducing super secondary grain growth in electrochemically deposited copper in narrow trenches and/or vias to be used in semiconductor devices.

26 Claims, 8 Drawing Sheets

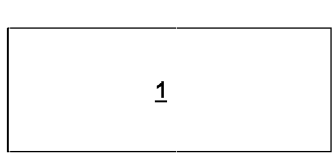
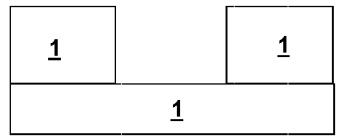
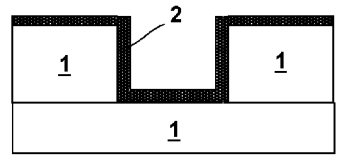
Fig. 1A
Fig. 1B
Fig. 1C
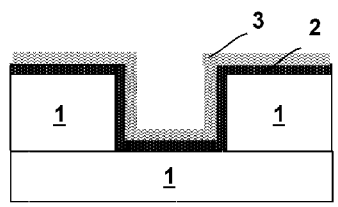
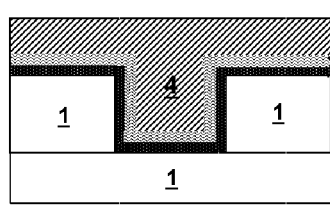
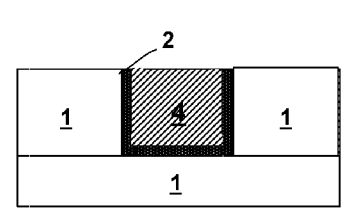
Fig. 1D
Fig. 1E
Fig. 1F
PRIOR ART

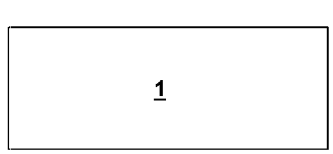
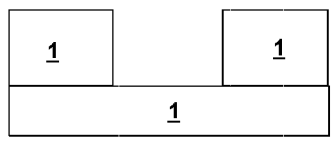
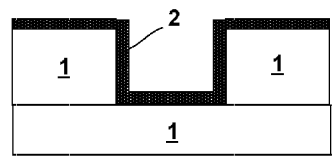
Fig. 4A　　　　　　　　Fig. 4B　　　　　　　　Fig. 4C
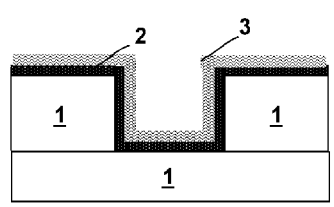
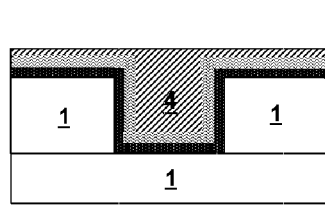
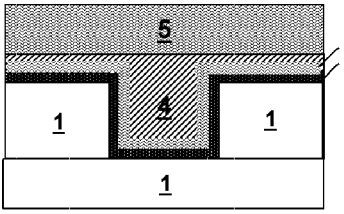
Fig. 4D　　　　　　　　Fig. 4E　　　　　　　　Fig. 4F
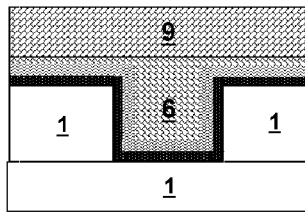
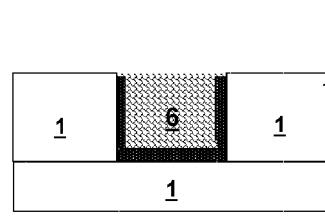
Fig. 4G　　　　　　　　Fig 4H (a) (b) (c)

METHOD TO CREATE SUPER SECONDARY GRAIN GROWTH IN NARROW TRENCHES

CROSS-REFERENCE TO RELATED APPLICATIONS

This application claims the benefit under 35 U.S.C. § 119 (e) of U.S. provisional application Ser. No. 60/790,634, filed Apr. 10, 2006, and claims the benefit under 35 U.S.C. § 119(a)-(d) of European application No. 06126251.5, filed Dec. 15, 2006, the disclosures of which are hereby expressly incorporated by reference in their entirety and are hereby expressly made a portion of this application.

FIELD OF THE INVENTION

The present invention is related to the field of semiconductor processing. More specifically it is related to a method for creating enlarged copper grains or inducing super secondary grain growth in electrochemically deposited copper in narrow interconnect structures to be used in semiconductor devices. It further contributes to the exploration of the field of narrow trenches and/or vias in semiconductor devices.

BACKGROUND OF THE INVENTION

Interconnects have been, are, and will continue to be a limiting factor for the performance and cost of integrated circuits. As technology scales down further, the problems associated with interconnects become ever more pressing. The introduction of low-resistive copper as an alternative interconnect material for aluminum presents researchers with some new challenges, since copper cannot be implemented in the same manner as aluminum alloys.

As feature sizes shrink, narrower copper trenches need to be formed. Also to facilitate closer packing and multilevel connections, trenches are getting proportionally smaller as they get narrower. These deep trenches etched into the dielectric must be filled completely, without voids or defects.

Physical Vapor Deposition (PVD) has long time been one of the techniques of choice for metallization in integrated circuits. In particular, sputter deposition has been widely used in the manufacturing of high-performance on-chip interconnect. However, due to the limitations of the PVD techniques and the continuing feature sizes it is generally believed that the applicability of PVD for the filling of deep trenches is coming to an end. Sputtering techniques are however widely used to deposit a thin layer of diffusion barrier and/or seed layer in said features. Unfortunately, PVD suffers from shadowing effects if the aspect ratio of features to be filled is sufficiently large. Said shadowing effects can form overhanging structures at the top corners of the trenches and vias. These effects can lead to void formation when attempting to fill a feature. Due to the geometrical shadowing, the film is preferentially deposited on the top corners leading to a "void" within the trench or via.

Electroplated (also referred to as electrochemically deposited or ECD) copper has therefore become the method of choice for filling narrow interconnect features in the back-end-of-line processing for microelectronics applications. However, as the trench width decreases, the influence of the PVD deposited seed layer becomes more important when its thickness is not scaled accordingly. This changes the grain growth dynamics in trenches as the volume fractions of ECD and PVD change significantly.

Typically copper lines are fabricated by patterning trenches into a dielectric layer with optical lithography. A barrier layer and Cu seed are deposited within the trenches, followed by electroplating in order to fill the structures. A Chemical mechanical polishing (CMP) step is used to remove excess copper and barrier material. A standard hot-plate anneal step (e.g. 30' at 250° C.) is introduced before CMP to enhance re-crystallization of copper in both seedlayer and plated copper.

The grain growth mechanism in thin PVD copper seed films and in plated (ECD) copper has been described by many authors. Typically, two growth modes are seen to occur simultaneously, known as normal and secondary grain growth to those working in the field. The latter leads to grain sizes of several times the thickness of a thin film or width of a trench and grain boundary motion is erratic. Normally grain growth in the seedlayer is intently retarded through process conditions in order to create a stable film for the subsequent ECD process.

Recently, a novel highly concentric grain growth mode, different from the commonly observed secondary grain growth (SGG) in ECD copper as described above, referred to as super-secondary-grain-growth (SSGG) has been discovered in thick PVD copper films by Vanstreels et al. Said SSGG was shown to occur only on alpha-Ta and produce copper grains of many tens of micrometers. In a second stage the SSGG grains initiated in the thick Physical Vapor Deposited (PVD) copper on alpha-Ta were shown to also be able to recrystallize a bilayer of said layer and an ECD Cu layer. In both the 'PVD-only' and the 'PVD-ECD bilayers' on alpha-Ta, the SSGG and SGG are both active and their rivalry determines the final grain structure obtained. It was shown by Vanstreels et al that SSGG dominates at low temperature, but that SGG gains in importance when the temperature is increased.

Because the SSGG produces [100] oriented super grains of several tens of micrometers, less grain boundaries are obtained and hence the resistance in copper having these super grains is lower. This makes the application of SSGG in interconnect structures very attractive. There is however still a need to understand the growth mechanisms of said SSGG, and to have said SSGG lead to large grains in interconnect structures (e.g. trenches) in semiconductor devices. So far, only growth in thin films has been demonstrated because the required thickness needed to make SSGG possible is larger than typical trench dimensions.

SUMMARY OF THE INVENTION

The preferred embodiments relate to a semiconductor device comprising at least one trench and/or at least one via filled with recrystallized electrochemically deposited copper (ECD-Cu), wherein at least 80%, 85%, 90%, 91%, or 92% of said recrystallized ECD-Cu consist of copper grains having a [100] orientation and dimensions of at least 10 micron.

Preferably, at least 93%, 94%, 95%, 96%, or 97% of said recrystallized ECD-Cu consist of said copper grains having a [100] orientation and dimensions of at least 10 micron.

More preferably, at least 98% or 99% of said recrystallized ECD-Cu consist of said copper grains having a orientation and dimensions of at least 10 micron.

Preferably, the dimensions of said copper grains with a [100] orientation are of at least 20 or 25 micrometers.

More preferably, the dimensions of said copper grains with a [100] orientation are of at least 50 micrometers.

Even more preferably, the dimensions of said copper grains with a [100] orientation are of at least 100 micrometers.

Preferably, said trench or trenches have a width of less than 200 nm in a semiconductor device according to the preferred embodiments.

Preferably, said trench(es) has (have) an aspect ratio (or height to width ratio) higher than 1.

Preferably, a semiconductor device according to the preferred embodiments comprises a diffusion barrier layer (for preventing the copper diffusion into the layer underneath, more particularly for preventing the copper diffusion into the dielectric layer underneath) and said recrystallized ECD-Cu upon said diffusion barrier layer. Preferably, said diffusion barrier layer has a thickness of less than 8 nm.

Preferably, said diffusion barrier layer is a layer comprising or consisting of tantalum (Ta), titanium (Ti), ruthenium (Ru), tungsten (W) and/or Manganese (Mn).

Another aspect relates to a method for filling at least one trench and/or at least one via with copper, comprising the steps of:
  providing said at least one trench and/or said at least one via by etching an opening in a layer of a dielectric material,
  depositing or forming a barrier layer (for preventing the copper diffusion into said dielectric material) in said opening,
  filling said opening with copper deposited by means of an electrochemical deposition (or electrochemical plating) process onto said barrier layer,
  directly upon said ECD-Cu, depositing a further copper layer by means of a Physical Vapor Deposition process,
  performing a thermal treatment for inducing recrystallization (i.e. for inducing super secondary grains growth) of said PVD-Cu, whereby recrystallization (i.e. super secondary grains growth) is also induced into said ECD-Cu (4),
  removing the copper overburden.

Preferably, in a method according to the preferred embodiments, said trench(es) has (have) a width comprised between 50 nm and 200 nm.

Preferably, said trench(es) has (have) an aspect ratio higher than 1.

In a method of the preferred embodiments, before the PVD deposition of copper (or inducing layer), said opening can be filled with ECD-Cu partially, substantially or completely. Preferably, said opening is completely filled with ECD-Cu.

Preferably, in a method according to the preferred embodiments, said thermal treatment (also referred to as thermal anneal) is performed at a temperature higher than the relaxation temperature of copper. More particularly, said thermal treatment is performed at a temperature higher than 80° C.

Preferably, said thermal treatment is performed at a temperature comprised between (about) 100° C. and (about) 420° C., more preferably comprised between (about) 100° C. and (about) 400° C., more particularly can be performed at (about) 130° C., and even more preferably at about 200° C.

Preferably, in a method according to the preferred embodiments, a substrate bias of 250 W is applied during said PVD deposition step for depositing said PVD-Cu.

Preferably, said thermal treatment is performed for at least 30 minutes, more preferably for at least 1 hour, and even more preferably for at least 1.5 hour.

Preferably, in a method according to the preferred embodiments, the thickness of the PVD-Cu layer (5) is comprised between 400 nm and 1000 nm, and more particularly is about 500 nm.

Preferably, in a method according to the preferred embodiments, said barrier layer can comprise or consist of tantalum (Ta), titanium (Ti), ruthenium (Ru), tungsten (W) and/or Manganese (Mn). Preferably, said barrier layer comprises or consists of α-Ta, β-Ta or TaN.

A method according to the preferred embodiments can further comprise, before the step of depositing said ECD-Cu, the step of depositing a copper seedlayer onto said barrier layer, preferably by means of a Physical Vapor Deposition process.

A method according to the preferred embodiments can further comprise, before the step of depositing said PVD-Cu, the step of removing the overburden of ECD-Cu and seedlayer, using said barrier layer as a stopping layer.

Said removal step of said overburden of ECD-Cu and seedlayer can be performed by chemical mechanical polishing (CMP).

Alternatively, in a method according to the preferred embodiments, Mn can be incorporated into a copper seedlayer (the Mn being incorporated during the step of depositing said copper seedlayer by Physical Vapor Deposition), and said Mn-containing-seedlayer is then submitted to a thermal treatment that causes the movement of the Mn towards the dielectric material such that the Mn-containing-seedlayer can act as a barrier layer. The deposition of a barrier layer prior to the deposition of said Mn-containing-seedlayer becomes then needless.

In a method according to the preferred embodiments wherein no seedlayer is deposited, the overburden of ECD-Cu (if any) can be removed by a wet and/or dry etchback process.

In a method according to the preferred embodiments the overburden of PVD-Cu and the overburden of barrier layer (if any or if remaining) can be removed by chemical mechanical polishing (CMP). Said removal can also be performed by dry and/or wet etchback.

In a method according to the preferred embodiments, Mn can be incorporated in said ECD-Cu for migrating, during said thermal treatment step (for recrystallization of both ECD-Cu and PVD-Cu), towards said dielectric layer, to act as barrier layer.

By adjusting the different parameters inherent to a method according to the preferred embodiments, and more particularly by adjusting the temperature during the thermal treatment, the thickness of ECD-Cu, the thickness of PVD-Cu, and/or the substrate bias applied, more than 80%, or more than 93%, and even more than 98% or 99% (all the values, integer or real number, between 80% and 99% being envisaged) of said recrystallized ECD-Cu can consist of copper grains with a [100] orientation having dimensions of at least 10 micron, of at least 20 or 25 micron or of at least 100 micron.

A method according to the preferred embodiments can be used in the framework of a damascene method or of a dual damascene method for forming an interconnect.

Another aspect relates to a semiconductor device obtainable by a method according to the preferred embodiments.

BRIEF DESCRIPTION OF THE DRAWINGS

All figures/drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIGS. 1A to 1F (PRIOR ART) illustrate the formation of conductive structures (e.g. trenches) and subsequent filling and recrystallization of copper within the trenches according to state of the art techniques.

FIGS. 4A to 4H illustrate an alternative and also preferred embodiment for formation and filling of narrow trenches (or vias) using electroplated copper. Said electroplated copper has a very thin overburden such that an extra planarizing step can be skipped. Subsequent recrystallization of the electroplated copper according to the method of the preferred embodiments leads to Super Secondary Grain Growth (SSGG) in said ECD-Cu.

DETAILED DESCRIPTION OF THE PREFERRED EMBODIMENTS

Figure 2A:
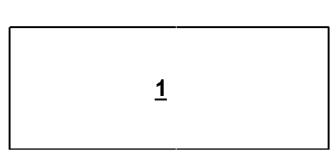
FIGS. 2A to 2I illustrate the preferred embodiment for formation and filling of narrow trenches (or vias) with electroplated copper (ECD-Cu) and subsequent recrystallization of the copper according to the method of the preferred embodiments to form (or to obtain) Super Secondary Grain Growth (SSGG) in said ECD-Cu.
Figure 2B:
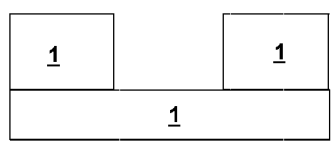
Figure 2C:
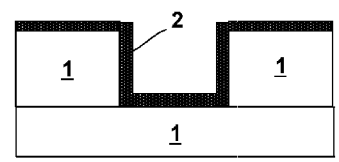
Figure 2D:
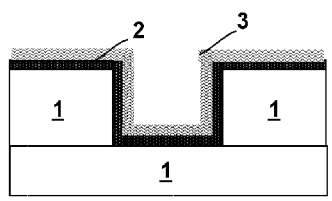
Figure 2E:
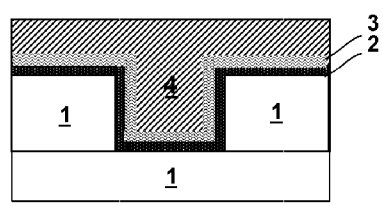

The drawings described are only schematic and are non-limiting. In the drawings, the size of some of the elements may be exaggerated and not drawn on scale for illustrative purposes. The dimensions and the relative dimensions do not correspond to actual reductions to practice of the invention.

In the context of the preferred embodiments, the term "Electrochemical Deposition" (ECD), also referred to as Electro Chemical Plating (ECP), refers to the process used to fill trenches and/or vias with copper to form interconnects structures on a wafer substrate. The ECD process is the process of depositing a metal (copper) by means of electrolysis and involves placing the wafer substrate in an aqueous electrolyte containing metal ions (e.g. Cu(II) ions).

The term "seedlayer" as referred to in this application is a layer used to provide a conductive path for the electric current that is required to electroplate copper. As such, an underlying conductive seed layer is generally applied to the wafer before it is subjected to an electrochemical deposition process. PVD is the preferred application process for the conductive seed layer because it can readily deposit copper on the barrier layer with relatively good adhesion.

The term "direct plating" refers to Electrochemical Deposition (ECD) or Electro Chemical Plating (ECP) using highly resistive barrier layers such that no seedlayer is needed and direct plating onto the barrier layer is possible.

The orientation of the secondary grains and/or of the super secondary grains is expressed as a direction [xyz] parallel to the substrate. Super secondary grains have a [100] orientated growth while secondary grains have a [111] orientated growth.

In the context of the preferred embodiments, the term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

Furthermore, the term "anneal" as used in the description refers to a heat treatment to which a wafer is subjected in order to modify properties of materials or structures processed on its surface or in the bulk.

The preferred embodiments provide a method for creation of super secondary grains in narrow conductive structures such as trenches and vias in a semiconductor device.

The method of the preferred embodiments is suitable for filling of an opening (a trench and/or a via) to form interconnect structure, e.g. a single damascene structure (SD) or a dual damascene structure (DD), with SSG.

A method is disclosed for filling trenches and/or vias for forming copper interconnect structures in a semiconductor device, said copper being characterized as recrystallized electrochemically deposited copper and having enlarged copper grains with a [100] orientation.

Said enlarged copper grains, also referred to as super secondary grains (SSG), result from the recrystallization of ECD-Cu, said recrystallization of said ECD-Cu being induced by the recrystallization initiated into a PVD deposited copper layer (PVD-Cu) contacting and being situated on top of said ECD-Cu.

Into said PVD deposited copper layer (PVD-Cu), super secondary grains are induced, said super secondary grains grow (expand) further into the electrochemically filled copper trench.

The preferred embodiments are based on the surprising discovery that the super secondary grains (SSG) after being induced in a PVD-Cu layer grow further into electrochemically filled copper trench, said electrochemically filled copper trench being situated underneath and in direct contact with said PVD-Cu layer. Indeed, said SSG cannot be obtained by annealing an ECD-Cu layer that is not into direct contact with a PVD-Cu layer.

The initially concentric growth of the super secondary grains in said PVD-Cu layer continues in other directions (towards and into the interconnect structure) and seems not hampered when it is limited in one direction.

More specifically a method is disclosed to create (to allow) super secondary grain growth within narrow interconnect structures (trenches and/or vias) in semiconductor devices, said super secondary grains having a [100] oriented structure and a length of several tens of microns; said interconnect structures being preferably part of a single or dual damascene structure.

The method of the preferred embodiments provides processing steps to create narrow trenches and/or vias filled with low resistivity copper being characterized as having super secondary grains. Recrystallized ECD-Cu according to a method of the preferred embodiments exhibits lower resistivity than ECD-Cu obtained by standard methods.

The processing preferably starts with first etching an opening (trench or via) in a dielectric layer.

Said dielectric layer can be any suitable material to be used as dielectric material in semiconductor processing. Preferably, said dielectric layer is a low-k dielectric material (i.e. a dielectric material having a dielectric constant lower than that of $SiO_2$).

If the opening is a trench, said trench opening preferably has a width of less than 200 nm and an aspect ratio of more than unity.

Preferably, subsequently, a copper diffusion barrier layer is deposited in said opening.

Said barrier layer is preferably a thin tantalum (Ta) comprising layer deposited by Physical Vapor Deposition (PVD) or atomic layer deposition (ALD).

Most preferred, but not limited to, said Ta comprising barrier layer is an $\alpha$-Ta, $\beta$-Ta or TaN comprising layer.

Said barrier layer can be an $\alpha$-Ta, $\beta$-Ta or TaN layer.

The barrier layer has preferably a thickness of less than 8 nm and more preferred has a thickness of less than 10% of the trench width.

Other (bi-)layers that act as a copper diffusion barrier (e.g. WCN, and Ta(N)/Ru) can also be considered.

To perform electrochemical plating onto said barrier layer, a thin copper seedlayer can be deposited, said seedlayer is preferably deposited by PVD.

Direct plating can also be performed, for which there is no need to deposit a copper seedlayer onto the barrier layer. Direct plating uses highly resistive barrier layers such that no seedlayer is needed and direct plating onto the barrier layer is possible.

The remaining part of the trench opening is then filled with electrochemically plated copper (ECD-Cu). Said opening can be partially filled, substantially filled or completely filled. Preferably, the opening is completely filled.

The overburden of ECD-Cu and (optionally) of PVD-Cu seedlayer (if any) can be removed (from the field area) using the barrier layer (on the field) as a stopping layer.

The removal process is preferably a chemical mechanical polishing step. Alternatively a wet or dry etchback process can be used.

A second thick copper layer (preferably thicker than the ECD-Cu layer), further referred to as inducing layer is deposited onto the planarized surface by Physical Vapor Deposition (PVD-Cu) using a high bias.

Said high bias is preferably higher than 150 W. More preferred said bias is at least 250 W for a 200 mm wafer. The optimal bias setting for a 300 mm wafer is thus higher.

The thickness of said second PVD-Cu layer or inducing layer is preferably in the range of 400 nm to 1000 nm and most preferred 500 nm.

A thermal anneal is performed to induce super secondary grain growth in the thick PVD-Cu inducing layer. Then said super secondary grains further "migrate" (or grow, or expand) further into the ECD-Cu such that lower resistivity copper having super secondary grains (SSG) is obtained.

The expansion process has to be understood as a process during which the induced SSG keep on growing such that they grow further into the narrow structures filled with ECD-Cu, such that said SSG substantially fill said narrow structures.

The thermal anneal is performed at temperatures above the relaxation temperature of copper. Said relaxation temperature is about 80° C. Said thermal anneal can be performed at temperatures in the range of 80° C. up to 120° C. Preferably, said thermal anneal is performed at temperatures in the range of 100° C. up to 420° C., more preferably in the range of 100° C. up to 400° C. and even more preferably around 200° C.

After completion of the SSGG process and formation of SSG in the ECD-Cu structure, the overburden of the second PVD-Cu inducing layer is removed.

The removal is preferably performed by chemical mechanical polishing (CMP) or alternatively by a wet and/or dry etchback process.

The barrier layer on the field can be removed subsequently to the removal of the inducing layer.

Alternatively, when using an ECD process that produces a very thin overburden, the PVD copper inducing layer can be deposited directly on top of this ECD layer without the intermediate CMP step. And the final CMP step removes the PVD inducing layer, barrier layer, seedlayer (if any) and ECD-Cu on the field.

In another alternative, the barrier step can be skipped and a seedlayer comprising Mn can be deposited before ECD. This Mn solute then forms a barrier layer during the thermal anneal step.

Alternatively, Mn can be incorporated in ECD-Cu during plating. Said Mn then migrates during a thermal anneal towards the dielectric and act there as a barrier.

The preferred embodiments also relate to a semiconductor device having at least one interconnect structure filled with (recrystallized) electrochemically deposited copper (ECD-Cu), said ECD-Cu is further characterized as low resistivity copper and having super secondary copper grains (SSG). Said SSG have a [100] orientation.

More specifically, more than 80% of said recrystallized ECD copper are in the form of SSG with a [100] orientation.

Preferably, more than 93% of said recrystallized ECD copper are in the form of SSG with a [100] orientation.

More preferably, more than 98% of said recrystallized ECD copper are in the form of SSG with a [100] orientation.

Making such a strong oriented copper structure is an advantage for the electro-migration of the copper.

Said SSG are further characterized as having dimensions of at least 10 micron. Preferably, said SSG have dimensions of at least 20 micron, of at least 25 micron, of at least 50 micron, and more preferably of at least 100 micron.

Said SSG grains are first formed in a PVD-Cu inducing layer which is into contact with said ECD-Cu and said SSG grains "migrating" (or growing, or expanding) further in said ECD-Cu. The PVD-Cu layer is preferably removed after "migration" (or growth, or expansion) of the SSG into the ECD-Cu.

Interconnect structures made of copper having enlarged copper grains have improved resistivity due to a decrease of the number of grain boundaries per unit volume.

Said enlarged copper grains have preferably a dimension of at least 10 micron ($\mu m$), more preferred more than 25 micron ($\mu m$) and most preferred more than 100 micron ($\mu m$), whereas the conventional secondary copper grains as obtained after an anneal of ECD-Cu have dimensions of 1-2 microns ($\mu m$).

The copper used in a method or a semiconductor device according to the preferred embodiments preferably includes alloys of copper of the kind typically used in the semiconductor industry. More preferably, and according to preferred embodiments, a copper alloy comprising about 98% by weight of copper is used.

A method according to a preferred embodiment is illustrated in FIGS. 2A to 2H.

A method of the preferred embodiments solves the problem of filling trenches having aspect ratios greater than 1 for forming interconnect structures without voids and with low resistivity copper.

Physical Vapor Deposition (PVD) of copper gives rise to a more dense deposited copper layer compared to an Electrochemical deposited (ECD) copper layer but filling said trenches with PVD is however not wanted because this technique leads to void formation in shallow structures.

On the other hand, ECD is known as a technique capable of perfect bottom-up fill of narrow features.

It is further known that stress in a PVD deposited copper can be tuned during the deposition process by tuning the substrate bias, leading to an excess (e.g. more than 80%) of the more preferred [100] orientation of the copper such that growth of super secondary copper grains (SSG) is possible.

Unexpectedly, the preferred embodiments combine the benefits of both techniques for filling trenches and/or vias for forming interconnect structures or in other words makes the growth of SSG possible within said trenches and/or vias filled with ECD copper.

The formation of SSG in narrow trenches (and/or vias) is disclosed.

Said super secondary grains (SSG) have a [100] oriented structure and a length of several tens of microns. Said enlarged copper grains have preferably dimension of at least 10 micron (μm), more preferred more than 25 micron (μm) and most preferred more than 100 micron (μm) whereas the conventional secondary copper grains as obtained after an anneal of ECD-Cu have dimensions of 1-2 microns (μm).

After applying a method of the preferred embodiments, more than 80% of said ECD copper has a [100] orientation (in the form of SSG), more preferred more than 93% of said ECD copper has a [100] orientation and most preferred 98% of said ECD copper has a [100] orientation.

Making such a strong oriented copper structure is an advantage for the electro-migration of the copper.

Said SSGG are created in ECD-Cu by first inducing super secondary grains in an inducing layer covering the top of said ECD-Cu structure. Said inducing layer is a PVD deposited copper (containing) layer.

A method according to the preferred embodiments comprises the steps of first creating an opening (i.e. trench or via) for forming an interconnect structure in a substrate.

Said substrate is preferably a semiconductor wafer comprising active devices with on top of said substrate a dielectric layer 1 such as $SiO_2$, or a low-k dielectric such as CVD deposited SiCOH materials (e.g. Black Diamond®), or organic spin-on materials (e.g. Silk®), etc.

Photolithographic patterning followed by reactive ion etching is used to perform the etching of the opening (trench or via) in said dielectric layer 1.

If the opening is a trench, said trench opening preferably has a width of less than 200 nm and an aspect ratio of more than unity.

Subsequently a continuous barrier layer 2 is deposited onto said dielectric layer 1, said barrier layer 2 is deposited as a continuous layer onto the sidewalls and bottom of the opening as well as onto the upper part of the dielectric layer (also referred to as overburden).

Said copper diffusion barrier layer 2 can be a Ta comprising layer such as α-Ta (crystalline), β-Ta (crystalline) or a TaN (amorphous) layer.

Other state of the art copper diffusion barrier layers are also possible; examples are Ti comprising layers (e.g. TiN/Ti), W comprising layers (e.g. WCN), Ru comprising layers, etc.

The barrier layer 2 is preferably deposited by Physical Vapor Deposition (PVD) or Atomic Layer Deposition (ALD). Said PVD deposited layer has preferably a thickness lower than 8 nm. Preferably the thickness of the barrier layer 2 is less than 10% of the trench width.

In a preferred embodiment, onto the barrier layer, a seedlayer 3 can be deposited. Said seedlayer 3 is preferably characterized as a PVD deposited copper layer with thickness in the range of preferably 10 nm up to 70 nm and more preferred around 30 nm. Said seed layer 3 is deposited uniformly on top of the previously deposited barrier layer 2. Most preferred the sidewalls of the opening are covered completely by a seedlayer 3. The seedlayer 3 provides a conductive path for the electrochemical plating afterwards.

After deposition of the seedlayer 3, the substrate is immersed in a plating solution such that copper from the plating bath can be electrochemically deposited onto the seed layer. A complete filling of the opening (trench or via) with ECD-Cu 4 can be obtained. As a side effect, an overburden of copper is present on the field area.

Depending on the thickness of the ECD-Cu overburden, the overburden (ECD-Cu) is then removed by means of chemical mechanical polishing (CMP) or etchback.

Figure 2F:
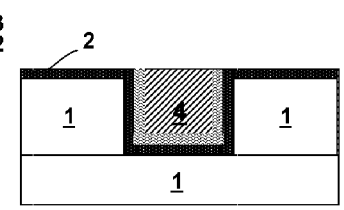

The barrier layer 2 present on the field can serve as a stopping layer for etchback or CMP as illustrated in FIG. 2F.

Figure 2G:
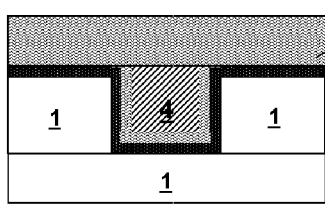
Figure 2H:
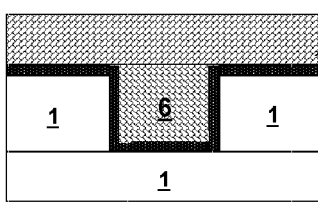
Figure 2I:
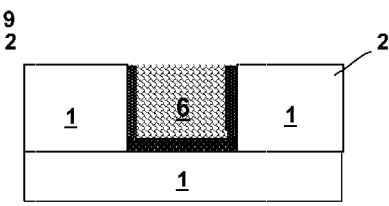
Figure 3A:
FIGS. 3A to 3I illustrate an alternative and also preferred embodiment for formation and filling of narrow trenches (or vias) using direct plating of copper onto a resistive barrier layer and subsequent recrystallization of the copper according to the method of the preferred embodiments to form (or to obtain) Super Secondary Grain Growth (SSGG) in said ECD-Cu.
Figure 3B:
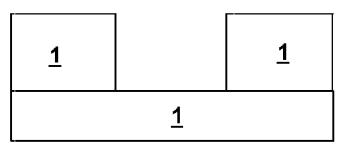
Figure 3C:
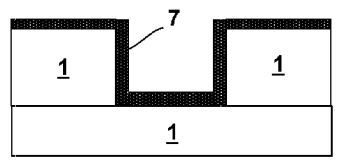
Figure 3D:
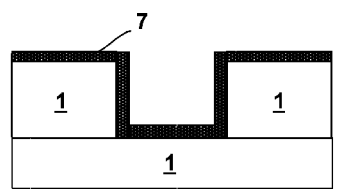
Figure 3E:
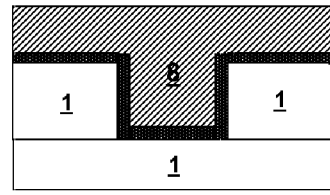
Figure 3F:
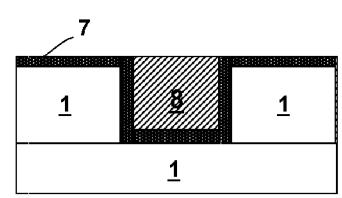
Figure 3G:
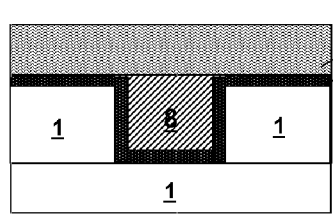
Figure 3H:
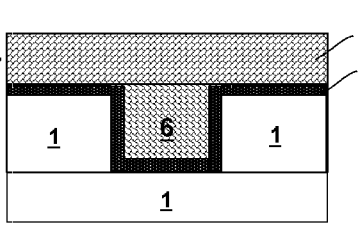
Figure 3I:
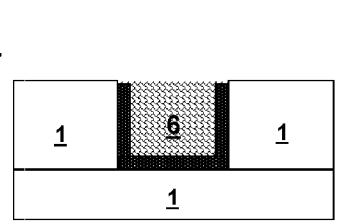
Figure 5:
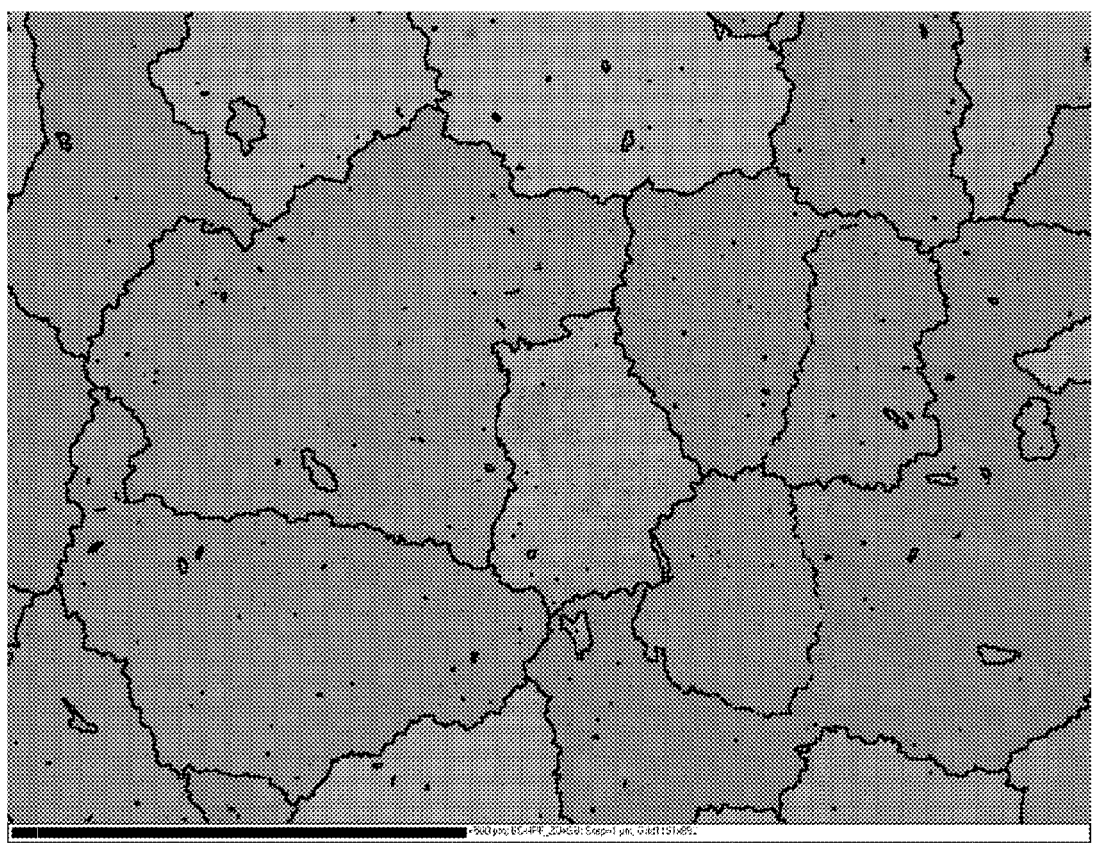
FIG. 5 illustrates super secondary grains in a 500 nm thick PVD film deposited at 250 W and annealed at 250° C. for 1 hour (scalebar=500 μm).

As shown in FIG. 2G, a thick copper layer is deposited onto said planarized surface, said copper layer is a PVD deposited copper layer using a high bias during deposition.

Said high bias setting can be tool specific. A preferred bias is higher than 150 Watt and more preferred around 250 W for a 200 mm wafer.

The optimal bias setting for a 300 mm wafer will be higher than for a 200 mm wafer.

Said thick PVD-Cu layer 5 is further referred to in this application as an inducing layer.

The thickness of the PVD-Cu inducing layer 5 is preferably in the range of 400 to 1000 nm and most preferred around 500 nm.

The PVD-Cu layer is also characterized as a layer having a high stress (due to the high substrate bias applied during deposition).

Recently developed PVD deposition techniques such as Ion Metal Plasma (IMP) and Self Ionized Plasma (SIP) deposition are also envisaged.

Subsequently, a thermal treatment or thermal anneal is performed such that a recrystallization within the PVD-Cu inducing layer 9 is achieved.

The period of time between the deposition of the inducing layer (PVD-Cu) and the thermal anneal is preferably as short as possible.

Most preferred the thermal anneal is performed at temperatures just above the relaxation temperature of copper, said relaxation temperature of copper being in the range of 80° C. up to 120° C.

Said anneal temperature is preferably in the range of 100° C. up to 420° C., and more preferably between 100° C. and 400° C. More particularly, said anneal temperature is around 130° C. and more preferably about 200° C.

Figure 6:
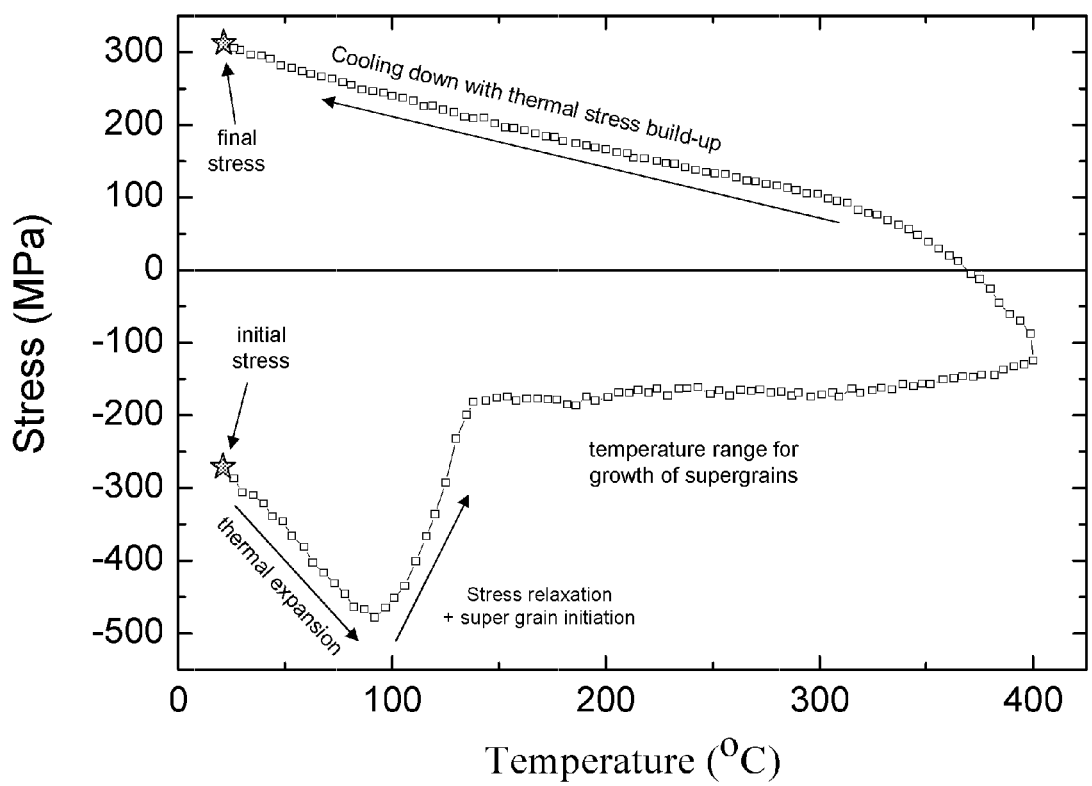
FIG. 6 illustrates the stress in ECD deposited copper as a function of the (annealing) temperature indicating the temperature range for growth of supergrains according to the method of the preferred embodiments.
Figure 7:
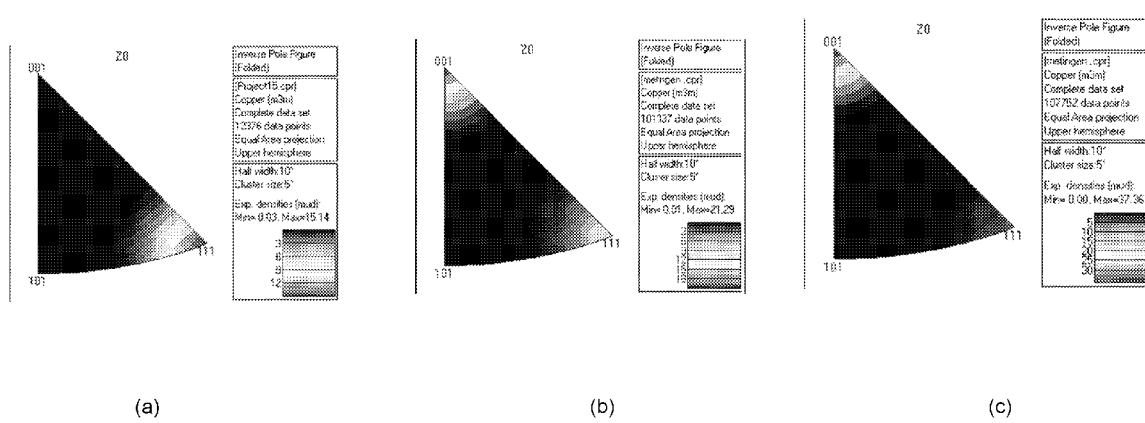
FIG. 7(a) illustrates the distribution of crystallographic orientations as observed in ECD deposited copper having the original [111] crystallographic orientation (texture).
FIG. 7(b) represents a grain structure where both SGG and SSGG grains are present. For the condition where SSGG is most complete as shown in FIG. 7(c) the original [111] texture of the as-deposited film has disappeared completely (after performing the method of the preferred embodiments).
Figure 8:
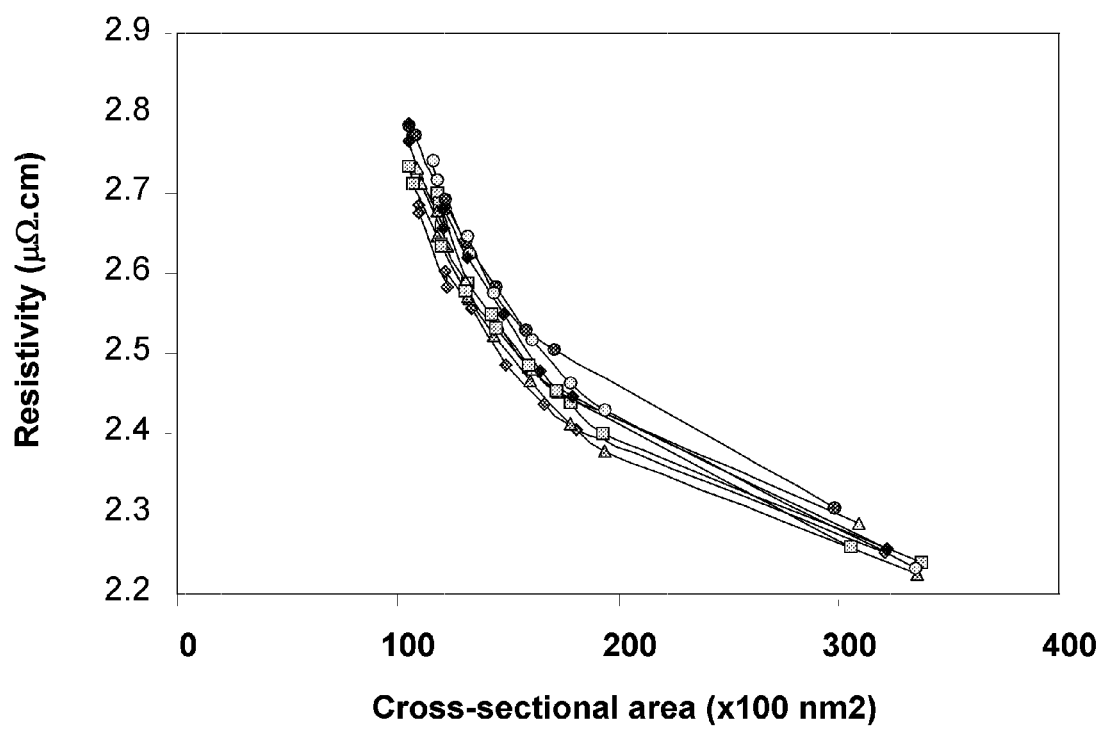
FIG. 8 illustrates standard resistivity values for Cu trenches (i.e. without carrying out the method according to the preferred embodiments) as a function of the cross-sectional area of the trench (trench height=130 nm).

FIG. 6 illustrates the stress release within the PVD-Cu layer as a function of the anneal temperature.

The optimal temperature range for the thermal anneal of the preferred embodiments during which stress relaxation is achieved and SSG growth is optimal is indicated.

During the thermal anneal, SSG are induced in said inducing layer (PVD-Cu) and said SSG expand further into the ECD-Cu underneath.

Said thermal anneal step is preferably performed during 0.5 hour (30 minutes) minimum, preferably during more than 1 hour and most preferred around 1.5 hour.

A minimum anneal time is necessary for generating and expanding said SSGG, and can be adjusted in function of different parameter and in particular in function of the bias applied, of the thickness of the ECD-Cu and PVD-Cu layers, or of the percentage of copper grains with an [100] orientation and with dimensions higher than 10, 25 or 100 µm envisaged.

During said thermal anneal, super secondary grain growth (SSGG) is induced in said PVD-Cu inducing layer 9.

Said SSGG leads to the formation of super secondary grains (SSG) having a [100] orientation and grains sizes of at least several tens of micrometers. The SSG have a grain growth rate of approximately 100 µm/hour.

The optimal time of the thermal anneal to transform the ECD-Cu (creating more than 80% SSG in said ECD-Cu) is further dependent on the chemistry (plating bath composition) used to deposit the ECD-Cu.

Said SSG are characterized as having low resistivity and improved electro-migration, and due to their (large) size there are very few grain boundaries. Said SSG continue growing into the ECD-Cu underneath such that the opening is at least partly filled with SSG 6.

After thermal anneal, the PVD-Cu inducing layer 9 and barrier layer 5 are removed.

Removal is preferably achieved by means of Chemical Mechanical Polishing or alternatively by wet and/or dry etchback techniques.

In an alternative and also preferred embodiment, direct plating onto highly resistive barrier layers is used as technique to fill the opening electrochemically with copper.

This alternative is schematically shown in FIGS. 3A to 3I, having direct plated ECD-Cu 8 onto the barrier layer in the opening.

This alternative makes the step of depositing a seedlayer onto the barrier layer needless.

Said highly resistive barrier layer can be a TiN/Ti layer or a TaN layer.

Alternatively, a thin layer or clusters of a noble metal (e.g. Pt, Pd, or Ru) can be deposited onto the barrier layer to favor the direct plating process.

In yet another alternative and also preferred embodiment, electrochemical deposition of copper is optimized such that only a very thin overburden of ECD-Cu is formed onto the field area.

This makes the step of removing the ECD-Cu (e.g. by means of CMP) on the field needless.

A final CMP step removes the PVD-Cu inducing layer as well as the seedlayer and ECD-Cu on the field. This alternative is schematically shown in FIGS. 4A to 4H.

In yet another alternative and also preferred embodiment, a barrier layer deposition can be skipped and Mn can be incorporated in copper (e.g. an alloy of Mn and Cu, e.g. wherein Mn represents 5 w. % to 15 w. % of the alloy and copper the complement) during deposition of copper.

Mn can be e.g. incorporated in the Cu seedlayer during seedlayer deposition onto the sidewalls of and the bottom of the (via or trench) opening.

Alternatively Mn can be incorporated into the ECD-Cu during the electrochemical plating process.

During the thermal anneal as described in previous embodiments to induce SSGG, Mn migrates towards the dielectric material and act as barrier.

This alternative is extremely useful in dual damascene processing to create self-aligned barrier layers in the dual damascene structure (leading to direct Cu—Cu contact).

All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A method for filling a structure with copper, the method comprising the steps of:
    etching an opening in a layer of a dielectric material, whereby a structure selected from the group consisting of a trench and a via is formed;
    depositing or forming a barrier layer in said opening for preventing copper diffusion into said dielectric material;
    filling said opening by depositing copper in an electrochemical deposition or electrochemical plating process onto said barrier layer;
    depositing a further copper layer by physical vapor deposition directly upon said electrochemically deposited copper;
    performing a thermal treatment for inducing recrystallization of said physical vapor deposition deposited copper, whereby recrystallization is also induced in said electrochemically deposited copper; and
    removing a copper overburden.

2. The method according to claim 1, wherein said structure is a trench, and wherein said trench has a width of from 50 nm to 200 nm.

3. The method according to claim 2, wherein said trench has an aspect ratio higher than 1.

4. The method according to claim 1, wherein said thermal treatment is performed at a temperature of from about 100° C. to about 420° C.

5. A method according claim 1, wherein said thermal treatment is performed at a temperature of about 200° C.

6. The method according to claim 1, wherein a substrate bias of 250W is applied during said physical vapor deposition step for depositing said physical vapor deposition deposited copper.

7. The method according to claim 1, wherein said thermal treatment is performed for at least 30 minutes.

8. The method according to claim 1, wherein the thickness of the further copper layer is from 400 nm to 1000 nm.

9. The method according to claim 1, wherein said barrier layer comprises a metal selected from the group consisting of tantalum, titanium, ruthenium, tungsten, manganese, and combinations thereof.

10. The method according to claim 1, wherein said barrier layer comprises a material selected from the group consisting of α-tantalum, β-tantalum, tantalum nitride, and combinations thereof.

11. The method according to claim 1 further comprising, before the step of depositing said electrochemically deposited copper, the step of depositing a copper seedlayer onto said barrier layer by physical vapor deposition.

12. The method according to claim 1, wherein said barrier layer is formed by, first, incorporating manganese in a copper seedlayer during the deposition of said copper seedlayer by physical vapor deposition, and then annealing said manganese-containing seedlayer.

13. The method according to claim 1 further comprising, before the step of depositing said physical vapor deposition deposited copper, a step of removing an overburden of electrochemically deposited copper.

14. The method according to claim 11, further comprising a step of removing an overburden of said copper seedlayer, wherein said step is conducted before the step of depositing said physical vapor deposition deposited copper, during a step of removing an overburden of electrochemically deposited copper using said barrier layer as a stopping layer.

15. The method according to claim 13, wherein said step of removing an overburden of electrochemically deposited copper is performed by chemical mechanical polishing.

16. The method according to claim 14, wherein said step of removing an overburden of said copper seedlayer is performed by chemical mechanical polishing.

17. The method according to claim 1 further comprising a step of removing an overburden of physical vapor deposition deposited copper and an overburden of barrier layer.

18. The method according to claim 17, wherein said step of removing an overburden of physical vapor deposition deposited copper and an overburden of barrier layer is performed by chemical mechanical polishing.

19. The method according to claim 17, wherein said step of removing said overburden of physical vapor deposition deposited copper and an overburden of barrier layer is performed by at least one of a dry etchback and a wet etchback.

20. The method according to claim 1, wherein manganese is incorporated in said electrochemically deposited copper, wherein the manganese migrates, during said thermal treatment step, towards said dielectric layer to act as barrier layer.

21. The method according to claim 1, whereby at least 80% of said recrystallized electrochemically deposited copper consist of copper grains with a [100] orientation and dimensions of at least 10 microns.

22. The method according to claim 1, whereby at least 93% of said recrystallized electrochemically deposited copper consist of copper grains with a [100] orientation and dimensions of at least 10 microns.

23. The method according to claim 1, whereby at least 98% of said recrystallized electrochemically deposited copper consist of copper grains with a [100] orientation and dimensions of at least 10 microns.

24. A damascene method for forming an interconnect comprising the method according to claim 1.

25. A dual damascene method for forming an interconnect comprising the method according to claim 1.

26. A semiconductor device obtainable by the method according to claim 1.

* * * * *

UNITED STATES PATENT AND TRADEMARK OFFICE
CERTIFICATE OF CORRECTION

| | | |
|---|---|---|
| PATENT NO. | : 7,452,812 B2 | |
| APPLICATION NO. | : 11/733650 | |
| DATED | : November 18, 2008 | |
| INVENTOR(S) | : Beyer et al. | |

It is certified that error appears in the above-identified patent and that said Letters Patent is hereby corrected as shown below:

| Issued Patent | | 1. Description of Error |
|---|---|---|
| Column | Line | |
| Page 1 Item (57) Abstract Col. 2 | 2 | After "it" insert --is--. |

Signed and Sealed this
Fifteenth Day of February, 2011

David J. Kappos
*Director of the United States Patent and Trademark Office*